United States Patent
Wang et al.

(10) Patent No.: US 7,345,547 B2
(45) Date of Patent: Mar. 18, 2008

(54) BIAS CIRCUIT FOR BJT AMPLIFIER

(75) Inventors: Nanlei Larry Wang, Palo Alto, CA (US); Walter A. Strifler, Sunnyvale, CA (US)

(73) Assignee: WJ Communications, Inc., San Jose, CA (US)

( * ) Notice: Subject to any disclaimer, the term of this patent is extended or adjusted under 35 U.S.C. 154(b) by 106 days.

(21) Appl. No.: 11/253,203

(22) Filed: Oct. 17, 2005

(65) Prior Publication Data
US 2007/0096823 A1     May 3, 2007

(51) Int. Cl.
*H03G 3/30* (2006.01)
(52) U.S. Cl. .................................. 330/285; 330/296
(58) Field of Classification Search ............... 330/285, 330/296
See application file for complete search history.

(56) References Cited

U.S. PATENT DOCUMENTS

| | | |
|---|---|---|
| 1,850,187 A | 3/1932 | Thewes |
| 2,114,971 A | 4/1938 | Segeler |
| 2,107,910 A | 8/1938 | Schumacher |
| 5,590,411 A | 12/1996 | Sroka et al. |
| 5,710,523 A | 1/1998 | Kobayashi |
| 5,850,187 A | 12/1998 | Carrender et al. |
| 6,107,910 A | 8/2000 | Nysen |
| 6,114,971 A | 9/2000 | Nysen |
| 6,275,687 B1 | 8/2001 | Lloyd |
| 6,300,837 B1 * | 10/2001 | Sowlati et al. ............. 330/296 |
| 6,333,677 B1 * | 12/2001 | Dening ...................... 330/285 |
| 6,486,739 B1 * | 11/2002 | Luo .......................... 330/296 |
| 6,529,080 B1 | 3/2003 | Seymour et al. |
| 7,154,336 B2 * | 12/2006 | Maeda ...................... 330/285 |

OTHER PUBLICATIONS

Chen, Shiao-Shien, et al. "Investigation of ESD Devices in 0.18-μm SiGE BiCMOS Process," IEEE 03CH37400 41st Annual International Reliability Physics Symposium, Dallas, Texas (2003) pp. 357-360.

Dunn, J., et al., "Trends in silicon Germanium BiCMOS Integration and Reliability," IEEE 00CH37059, 38th Annual International Reliability Physics Symposium, San Jose, CA (2000) pp. 237-242.

Iwai, Taisuke, et al., "42% High-Efficiency Two-Stage HBT Power-Amplifier MMIC for W-CDMA Cellular Phone Systems," IEEE Transactions on Microwave Theory and Techniques, vol. 48, No. 12, (Dec. 2000) pp. 2567-2572.

Kawamura, H., et al., "A Miniature 44% Efficiency GaAs HBT Power Amplifier MMIC for the W-CDMA Application", IEEE GaAs Digest (2000) pp. 25-28.

(Continued)

*Primary Examiner*—Khanh Van Nguyen
(74) *Attorney, Agent, or Firm*—Morgan, Lewis & Bockius LLP

(57) ABSTRACT

The embodiments of the present invention include a bias circuit for a power-amplifying device, which receives and amplifies an input RF signal having a series of RF cycles within a modulation envelop. The bias circuit compensates odd-order distortion processes by detecting the power in the input signal and providing a dynamic adjustment to a bias stimulus for the power-amplifying device within a time scale of the modulation envelope.

9 Claims, 10 Drawing Sheets

OTHER PUBLICATIONS

Jeon, Yong-Joon, et al., "Improved HBT Linearity With a 'Post Distortion'-Type Collector Linearizer," IEEE Microwave and Wireless Components Letters, vol. 13, No. 3, (Mar. 2003) pp. 102-104.

Kang, Sanghoon, et al., "Linearity Analysis of CMOS for RF Application," IEEE Radio Frequency Integrated Circuits Symposium, (2002), pp. 363-366.

Kim, Hye-Ryoung, et al., "A 5-GHz LNA for Wireless LAN Application Based on 0.5μm SiGe BiCMOS," 3rd International Conference on Microwave and Millimeter Wave Technology Proceedings, IEEE (2005) pp. 50-53.

Kim, Joon H., et al., "High Linear HBT MMIC Power amplifier with Partial RF Coupling to Bias Circuit for W-CDMA Portable Application," 3rd International Conference on Microwave and Millimeter Wave Technology Proceedings, IEEE (2005) pp. 809-812.

Ko, Jin-Su, et al., "Effect of Bias Scheme on Intermodulation Distortion and its Use for the Design of PCS Tx Driver," IEEE Radio Frequency Integrated Circuits Symposium, (2000) pp. 105-105.

Noh, Youn Sub, et al., "PCS/W-CDMA Dual-Band MMIC Power Amplifier With a Newly Proposed Linearizing Bias Circuit," IEEE Journal of Solid-State Circuits, vol. 37, No. 9, (Sep. 2002) pp. 1096-1099.

Taniguchi, Eiji, et al., "Dual Bias Feed SiGe HBT Low Noise Linear Amplifier," IEEE Radio Frequency Integrated Circuits Symposium, (2001) pp. 227-230.

Trask, Chris, "High Efficiency Broadband Linear Push-Pull Power Amplifiers Using Linearity Augmentation," IEEE International Symposium on Circuits and Systems, (2002) pp. II432-II435.

Voldman, Steven H., et al., "The Influence of Process and Design of Subcollectors on the ESD Robustness of ESD Structures and Silicon Germanium Heterojunction Bipolar Transistors in a BiCMOS SiGE Technology," IEEE 03CH37400, 41st Annual International Reliability Physics Symposium, Dallas, Texas (2003) pp. 347-356.

Voldman, Steven H., et al., "Silicon Germanium Heterojunction Bipolar Transistor Electrostatic Discharge Power Clamps and the Johnson Limit in RF BiCMOS SiGE Technology," Elsevier Science, Journal of Electrostatics, vol. 56, (2002) pp. 341-362.

Voldman, Steven H., "The State of the Art of Electrostatic Discharge Protection" Physics, Technology, Circuits, Design, Simulation, and Scaling, IEEE Journal of Solid-State Circuits, vol. 34, No. 9 (1999) pp. 1272-1282.

Wang, Albert, "Recent Developments in ESD Protection for RFIC's," IEEE (2003) pp. 171-178.

Yoshimasu, Tosjijiko, et al., "An HBT MMIC Power Amplifier with an Integrated Diode Linearizer for Low-Voltage Portable Phone Applications," IEEE Journal of solid-State Circuits, vol. 33, No. 9, (Sep. 1998) pp. 1290-1296.

* cited by examiner

BIAS CIRCUIT FOR BJT AMPLIFIER

FIELD OF THE INVENTION

The present invention relates to radio-frequency (RF) power amplifier circuits and, in particular, to bias circuits that serve to minimize distortion in the amplifier circuits.

BACKGROUND OF THE INVENTION

Electronic equipment such as computers, wireless devices, broadband devices, radios, televisions and other similar devices communicate with each another by transmitting signals through air, space and guided media such as wire, cable, microstrip, waveguide, and optical fiber. These transmission signals undergo a variety of processes throughout their communication paths, one of which involves amplifying the signals using power amplifiers.

A radio frequency (RF) power amplifier is a circuit that is capable of receiving an RF input signal and amplifying it to produce an RF output signal that is a magnified version of the input signal. RF power amplifiers are frequently used in communications systems such as wireless telephony, satellite links, optical transceivers, and cable television distribution systems. An RF amplifier typically includes at least one power-amplifying device, such as a power-amplifying transistor, and a bias circuit that sets a quiescent operating point of the transistor. The transistor may be a field effect transistor (FET) device, such as a laterally-diffused metal-oxide-semiconductor (LDMOS) transistor, or a bipolar junctions transistor (BJT) device, such as a heterojunction bipolar transistor (HBT).

In a transistor-based RF amplifier, there are tradeoffs between maximizing efficiency and preserving the fidelity of the RF signal. The efficiency of the amplifier is defined as the output RF signal power divided by the power supplied to the amplifier from a power supply. The fidelity of an amplified signal is often described in terms of a deviation from an ideal linear noiseless process and is characterized using a variety of metrics including harmonic distortion, intermodulation distortion, adjacent channel power ratio (ACPR), cross-modulation, error vector magnitude, and bit error rate, etc., most of which are interrelated. For communication systems involving a modulated carrier signal whose modulation frequency is a small fraction of the carrier frequency, odd-order intermodulation distortion (IMD) processes are the primary sources of deleterious signal distortion in power amplifiers. In a given communication system, the contributing effects of such distortion can be related to other performance metrics such as bit error rate and error vector magnitude. Thus, in the following description, odd-order IMD and its related ACPR characteristic are mainly used as the metrics for the fidelity of amplified signals. See Cripps, "Power Amplifiers for Wireless Communications," Artech House: Norwood, Mass., 1999, and Pedro and Carvalho, "Intermodulation Distortion in Microwave and Wireless Circuits," Artech House: Norwood, Mass., 2003.

Given the inherent tradeoff between efficiency and linearity (fidelity), practitioners in the art of power amplifier design have developed a broad portfolio of circuit concepts and methods for exercising this tradeoff. One primary technique for increasing the efficiency of a power amplifier is to control the conduction angle of the transistor device. Various classes of amplifiers have been devised to manage the conduction angle, such as class-A, class-AB, class-B, class-C, class-D, class-F, and class-S amplifiers, listed roughly in the order of reduced conduction angle. See Clark and Hess, "Communication Circuits: Analysis and Design," Wiley: New York, 1971, and H. L. Krauss et al., "Solid State Radio Engineering," Wiley: New York, 1980.

The reduced conduction angle allows the amplifier to approach the efficiency of a switching device at the expense of signal distortion and gain. Furthermore, BJT operation at high power (e.g., 2-10 W) and high voltage (e.g., >10V) requires substantial thermal ballasting in either or both of the base and emitter terminals of the power-amplifying transistor. See Anholt, "Electrical and Thermal Characterization of MESFETs, HEMTs, and HBTs," Artech House: Norwood, Mass., 1995. Such thermal ballasting helps to increase the current-handling capability and thermal stability of the power-amplifying device but at the same time degrade the linearity of the amplifier circuit. See Pedro and Carvalho, supra, and Vuolevei and Rahkonen, "Distortion in RF Power Amplifiers," Artech House: Norwood, Mass., 2003. The engineering challenge in modern RF power amplifier design is to devise circuits with an optimum configuration of transistor device, tuning, conduction angle and bias control to maximize efficiency while controlling odd-order distortion processes to meet the linearity specifications for a particular communication signal or system.

SUMMARY

The embodiments of the present invention include a bias circuit for a power-amplifying device that receives and amplifies an input RF signal having a series of RF cycles within a modulation envelop. The bias circuit compensates odd-order distortion processes by detecting the power in the input signal and providing a dynamic adjustment to a bias stimulus for the power-amplifying device within a time scale of the modulation envelope. The present invention is applicable in general to all reduced conduction angle amplifiers. In the examples described herein, class-B and class-AB amplifiers employing BJT or HBT power-amplifying devices are mainly discussed. For ease of discussion, the terms 'BJT' and 'class-AB' are used with the understanding that such terms encompass both 'BJT' and 'HBT' and both 'class-AB' and 'class-B', respectively, and with the assertion that the techniques described herein can be applied to other reduced conduction angle power amplifiers.

In one embodiment of the present invention, an amplifier circuit for amplifying an input RF signal has an input terminal for receiving the RF input signal, an output terminal for outputting an amplified RF signal, and an RF power-amplifying device having a base coupled to the input terminal and a collector coupled to the output terminal. The amplifier circuit further comprises a bias circuit coupled to the base of the RF power-amplifying transistor through at least one impedance element. The bias circuit is also coupled to the input terminal and configured to couple a portion of the RF input signal into the bias circuitry. The bias circuit thus produces a bias circuit gain that depends on the RF power level in the RF input signal and that compensates for voltage drops along a current path through the power amplifying device by raising the DC voltage at the base of the RF power-amplifying device in response to an increase in the RF power level in the RF input signal.

In one embodiment, the bias circuit includes a PN junction diode having first and second terminals, the first terminal being coupled to the base of the RF amplifying transistor through at least one impedance element, and the second terminal being coupled to a bypass capacitor, which is coupled to an RF ground in the amplifier circuit. The bypass capacitor therefore holds the second terminal at a constant voltage despite fluctuations in the RF signal. As the RF power level in the RF input signal is increased, the average voltage across the PN junction diode is decreased, causing the base voltage of the RF power-amplifying device to increase. The PN junction diode may be the base-emitter (or base-collector) junction of a detecting transistor and the bypass capacitor is coupled to the base of the detecting transistor.

The RF amplifier circuit further comprises a reference voltage terminal for connecting to a reference voltage supply, a bias voltage terminal for connecting to a bias voltage supply, a first bias transistor having a collector coupled to the reference voltage supply through a reference resistor, an emitter coupled to a circuit ground terminal through a first emitter degeneration resistor, and a base, and a second bias transistor coupled with the detecting transistor in a current mirror configuration, the second bias transistor having a base connected to the base of the detecting, transistor at a common connected base node, an emitter coupled to the base of the first bias transistor through a second emitter degeneration resistor, and a collector coupled to the bias voltage terminal. The bypass capacitor is coupled between the common connected base node and the circuit ground.

In some embodiments, the power-amplifying device includes at least one BJT device, and the bias circuit employs BJT components so that the current-mirror serves two functions simultaneously. One function is to provide a current-mirror or level-shifting operation required for setting and controlling the quiescent conditions for the BJT in the power-amplifying device. The second function is to respond to the modulation envelope in the input RF signal by rectifying each negative half cycle in the input RF signal. The charge accumulated in each negative half cycle is deposited in the bypass capacitor and a properly amplified and delayed version of this charge is returned back through the bias circuit to affect, on the time scale of the modulation, the base-to-emitter voltage of the RF amplifying transistor. When this dynamic bias action is adjusted correctly through proper design of the impedance elements, the embodiments of the present invention achieve a substantial reduction in odd-order intermodulation distortion over a useful power range (approximately 6-10 dB) while simultaneously providing the necessary bias isolation, matching, power/phase distribution, and ballasting over the power-amplifying device. In this way, the higher efficiency of reduced conduction angle operation is realized while the linearity requirements of the communication signal are satisfied.

The amplifier circuit may include an array of transistor cells in the power-amplifying device, with some or all of the other components of the amplifier circuit effectively distributed to provide proper RF phasing and ballasting across the array of transistor cells.

DETAILED DESCRIPTION

Figure 1:
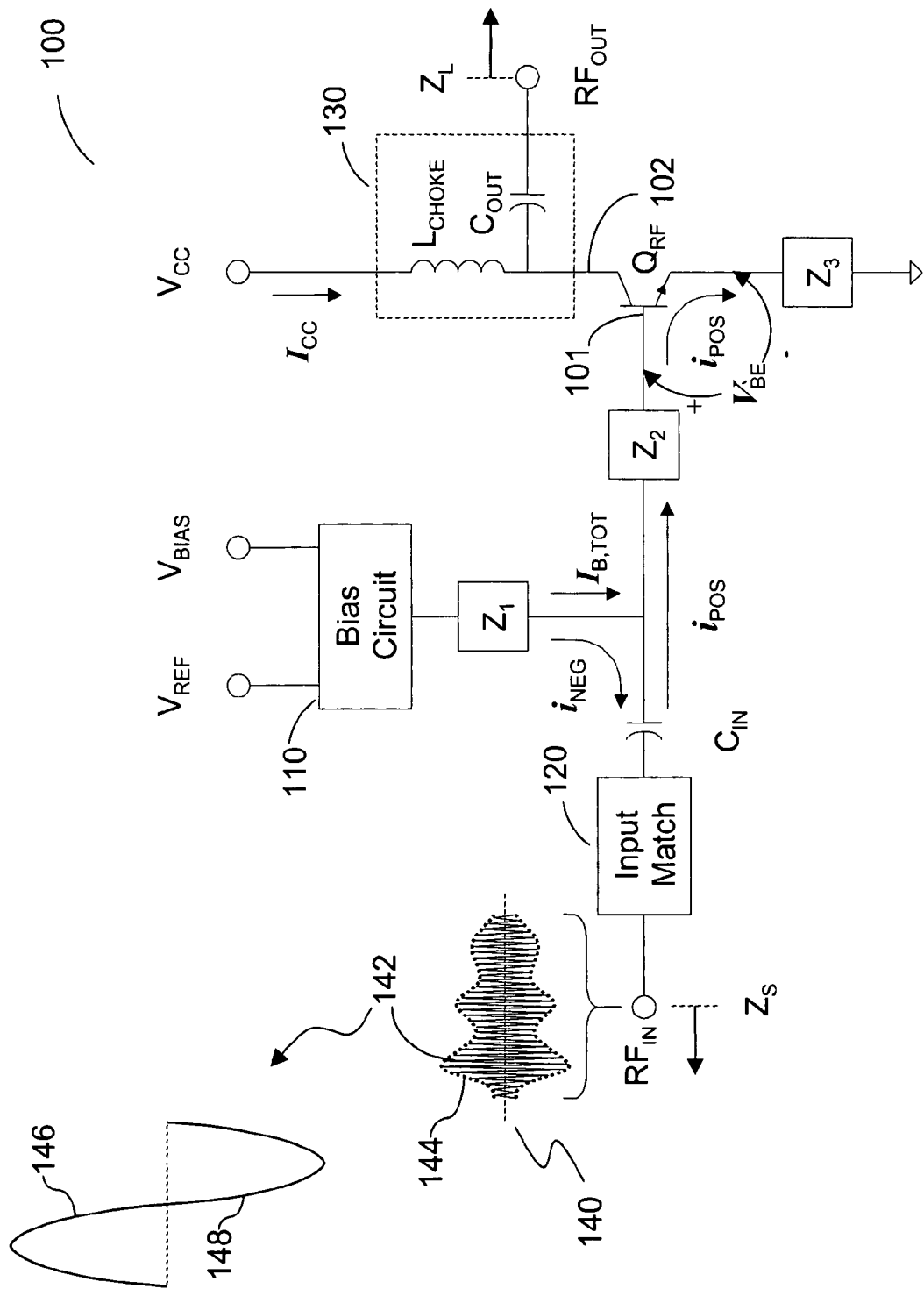
FIG. 1 is a functional block diagram of a bipolar junction transistor (BJT) amplifier circuit employing a reduced conduction angle amplifier, such as class-AB, class-B or class-C amplifier, according to one embodiment of the present invention.

FIG. 1 depicts a simplified block diagram of a single-stage transistor amplifier network (amplifier) 100, according to one embodiment of the present invention. As shown in FIG. 1, amplifier 100 includes an RF power-amplifying device $Q_{RF}$ having an input 101 and an output 102, a bias circuit 110 coupled to the input 101 of the power-amplifying device $Q_{RF}$, an input impedance matching section 120 also coupled to the input 101 of the power-amplifying device $Q_{RF}$ through a blocking capacitor $C_{IN}$, an output bias and impedance matching section 130 coupled to the output 102 of the power-amplifying device $Q_{RF}$, and terminals $RF_{IN}$, $RF_{OUT}$, $V_{REF}$, $V_{BIAS}$, and $V_{CC}$.

Terminal $RF_{IN}$ is coupled to the input impedance match section 120 for receiving an RF input signal, terminal $RF_{OUT}$ is coupled to the output bias and impedance match section 130 for outputting an amplified RF signal, terminal $V_{CC}$ is for connecting to a primary power supply voltage used to power the amplifier network 100 and is coupled to the output 102 of the power-amplifying device $Q_{RF}$ through the output bias and impedance matching section 130, and terminals $V_{REF}$ and $V_{BIAS}$ are input terminals for the bias circuit 110. The input terminals $V_{REF}$ and $V_{BIAS}$ connect with a reference voltage $V_{REF}$ and a bias voltage $V_{BIAS}$, respectively.

The reference voltage $V_{REF}$ is a well-controlled voltage used to set a quiescent bias condition for the amplifier network 100. It is commonly derived from a specialized bandgap reference circuit to provide a consistent DC voltage over a specified range of current at the output 102 of power-amplifying device $Q_{RF}$ and over a specified range of ambient temperature. The bias voltage $V_{BIAS}$ is from a DC voltage source with sufficient voltage amplitude and current capacity to power the bias circuit 110 and feed the input 101 of the power-amplifying device $Q_{RF}$. In common battery-powered applications, $V_{BIAS}$ is often connected to $V_{CC}$ through a suitable network of decoupling capacitors. In high voltage applications associated with high power amplifiers, the bias voltage $V_{BIAS}$ is often derived from $V_{CC}$ but is regulated down to a lower voltage.

In one embodiment, the power-amplifying device $Q_{RF}$ includes a bipolar junction transistor (BJT) having a base and a collector coupled to the input 101 and output 102 of the power-amplifying device $Q_{RF}$, respectively, and the amplifier 100 further includes impedance elements $Z_1$, $Z_2$, and $Z_3$. Impedance element $Z_1$ is coupled between the bias circuit 110 and the blocking capacitor $C_{IN}$, impedance element $Z_2$ is coupled between the impedance element $Z_1$ and the base of the BJT, and impedance element $Z_3$ is coupled between an emitter of the BJT and a circuit ground. Power-amplifying device $Q_{RF}$ may include a single transistor device, such as a BJT, or a transistor cell array, as discussed below. In a non-limiting example, the BJT is suitable for connecting to a high voltage (e.g., 10-28 V) $V_{CC}$ power supply can sustain a collector current $I_{CC}$ up to a maximum collector current $I_{Cmax}$ of about 100 mA.

Under small-signal operation, the bias circuit 110 provides the necessary bias current, $I_{BIAS}$, to the base of the power-amplifying device $Q_{RF}$, so as to set the quiescent bias condition of the amplifier network 100 while offering minimal RF loading to the base of the power-amplifying device $Q_{RF}$. The quiescent operating point is associated with a set of direct current (DC) operating conditions without any applied RF stimulus or input signal. In the case that the power-amplifying device $Q_{RF}$ includes a BJT, the set of DC operating conditions include such parameters as quiescent collector current $I_{CC}$, quiescent base current $I_B$, which comes from the bias current $I_{BIAS}$, quiescent base-emitter voltage $V_{BE}$, etc., for the power-amplifying BJT device. In addition to providing the bias current $I_{BIAS}$ for the power-amplifying device, the bias circuit 110 also controls the current and temperature compensation for the power-amplifying device.

The input impedance matching section 120 is designed to transform the impedance presented by the series combination of the blocking capacitor $C_{IN}$ and the input 101 of the power-amplifying device $Q_{RF}$ to the conjugate of a source impedance $Z_S$. The output bias and match section 130 serves two functions: one is to provide a low-loss path for a DC current to supply power to the power-amplifying device $Q_{RF}$. The second function is to provide a low-loss impedance transformation to maximize the transfer of RF power from the output 102 of the power-amplifying device $Q_{RF}$ to a load impedance $Z_L$.

Under large-signal class-AB operation, the RF input power in the RF input signal received at the input terminal $RF_{IN}$ reacts with the base-emitter junction of a BJT in the power-amplifying device $Q_{RF}$ to draw additional current from the bias circuit 110. This in turn draws more collector current $I_{CC}$ at the collector of the BJT from the $V_{CC}$ power supply. For a typical class-AB BJT in the power-amplifying device $Q_{RF}$, FIG. 2 demonstrates how the power gain GAIN, base-emitter voltage $V_{BE}$, and collector current $I_{CC}$ of the BJT responds to varying levels of continuous-wave RF input power ($P_{IN}$) and includes GAIN($P_{IN}$) curves 212, 214, and 216, $V_{BE}(P_{IN})$ curves 222, 224, and 226, and a $I_{CC}(P_{IN})$ curve. As discussed above, with increased RF input power $P_{IN}$, the interaction of the base-emitter junction of the BJT with the RF input power causes the bias circuit 110 to supply additional base current $I_B$. As the bias circuit 110 responds to supply more base current $I_B$, the finite resistance of bias circuit 110, along with $Z_1$, $Z_2$, and $Z_3$, causes the voltage $V_{BE}$ across the base-emitter junction of the power-amplifying device $Q_{RF}$ to decrease with increasing amount of RF input power $P_{IN}$, as shown by $V_{BE}(P_{IN})$ curves 222, 224, and 226.

The characteristics of the $V_{BE}(P_{IN})$ curves, along with the initial quiescent and tuning conditions, would determine the nature of the amplifer's gain response GAIN($P_{IN}$). In general, a $V_{BE}(P_{IN})$ function with decreasing $V_{BE}$ at low input power, as shown by the curve 226, would tend to exhibit a GAIN($P_{IN}$) characteristic with early gain compression, as shown by the GAIN($P_{IN}$) curve 216. A $V_{BE}(P_{IN})$ function that reasonably maintains $V_{BE}$ over a wider input power range, as shown by curve 222, would tend to exhibit flat gain or even gain expansion, as shown by curve 212. Curves 224 and 214 demonstrate normal situations. The detailed nature of the GAIN($P_{IN}$) characteristic and the dynamics of how this function responds to a modulated RF signal is closely related to the odd-order intermodulation distortion generated by the amplifier.

Under modulated RF drive conditions, a modulated RF signal is supplied to the input terminal $RF_{IN}$. A graphical depiction of a modulated RF signal 140 is also shown in FIG. 1 at the $RF_{IN}$ terminal and indicates the time-varying nature of an RF envelope 142 along with a magnified view of a single RF cycle 144 in an RF carrier. Since the frequency of the modulation is small compared to the frequency of the RF carrier, the time scale for changes to the envelope is long compared to the RF cycle time. Given the relatively slowly varying envelope, a single RF cycle will exhibit a positive half cycle 146 that closely matches its negative half cycle 148.

For a class-AB BJT in the power-amplifying device $Q_{RF}$ under large-signal operations, the RF input signal 140 can be viewed as a sequence of positive-half-cycle and negative-half-cycle perturbations to the quiescent bias condition of the BJT. During the positive half-cycle, the RF input signal is sufficient to turn ON the base-emitter junction of the BJT and transfer charge from the blocking capacitor $C_{IN}$ to the BJT with the flow of a first current component $i_{POS}$. During the negative half-cycle, the RF input signal is sufficient to turn OFF the base-emitter junction of the BJT, and in the absence of this conduction path, charge is transferred to the blocking capacitor $C_{IN}$ from the bias circuit 110 through impedance element $Z_1$ with the flow of a second current component $i_{NEG}$. The time integration of these two current components creates an increasing DC base current $I_{B,TOT}$ with increasing RF input power and leads directly to the upward $I_{CC}(P_{IN})$ curve shown in FIG. 2. These two current components also interact with $Z_1$, $Z_2$, $Z_3$ and the bias circuit 110 to affect other characteristics such $V_{BE}(P_{IN})$, Gain($P_{IN}$) and the odd-order IMD of the amplifier circuit 100.

Impedance elements such as $Z_2$ and/or $Z_3$ are often required for BJT power-amplifying devices because BJT operation at high power (e.g., 2-10 W) and high voltage (e.g., >10 V) requires substantial thermal ballasting in either or both of the base and emitter terminals of the power-amplifying device $Q_{RF}$. Unlike its FET counterpart, a BJT RF power-amplifying device often requires proper base impedance tuning at both the second harmonic frequency as well as the modulation frequency to achieve optimum linear performance. A simple input matching circuit 110 outside the bias current path is unable to satisfy these requirements for RF frequencies near 1 GHz and above. So, when a BJT is used as power-amplifying device $Q_{RF}$, the inclusion of $Z_1$ and/or $Z_2$ is often necessary to provide a combination of emitter and base ballasting with the equivalent effect of:

$$R_{ballast} \approx Z_{3,DC} + (Z_{1,DC} + Z_{2,DC})/\beta$$

where $Z_{1,DC}$, $Z_{2,DC}$, and $Z_{3,DC}$ are the DC resistance associated with the impedance elements of $Z_1$, $Z_2$, and $Z_3$, respectively.

Having included the three impedance elements $Z_1$, $Z_2$, $Z_3$ to meet the stated electro-thermal requirements, it is found that these same elements also hinder the flow of $i_{NEG}$ and $i_{POS}$ under large signal operation and cause $V_{BE}(P_{IN})$ to drop prematurely with increasing input power $P_{IN}$. This leads to poor large-signal RF power and linearity performance as depicted by curves 216 and 226 in FIG. 2. The present invention seeks to remedy this problem by constructing the bias circuit 110 that interacts cooperatively with the blocking capacitor $C_{IN}$, the power-amplifying device $Q_{RF}$, and the three impedance elements $Z_1$, $Z_2$, and $Z_3$ to simultaneously satisfy the electrical and thermal requirements for stable, efficient, and linear class-AB BJT amplifier operation.

In the following descriptions, like reference characters and symbols designate like or corresponding parts in the various embodiments. For example, the circuit element such as $C_{IN}$ or $Q_{RF}$ performs similar functions in the illustrated embodiments. It is understood that the exemplary illustrations are for the purpose of describing the preferred embodiments of the present invention and are not intended to limit the invention thereto.

Figure 3:
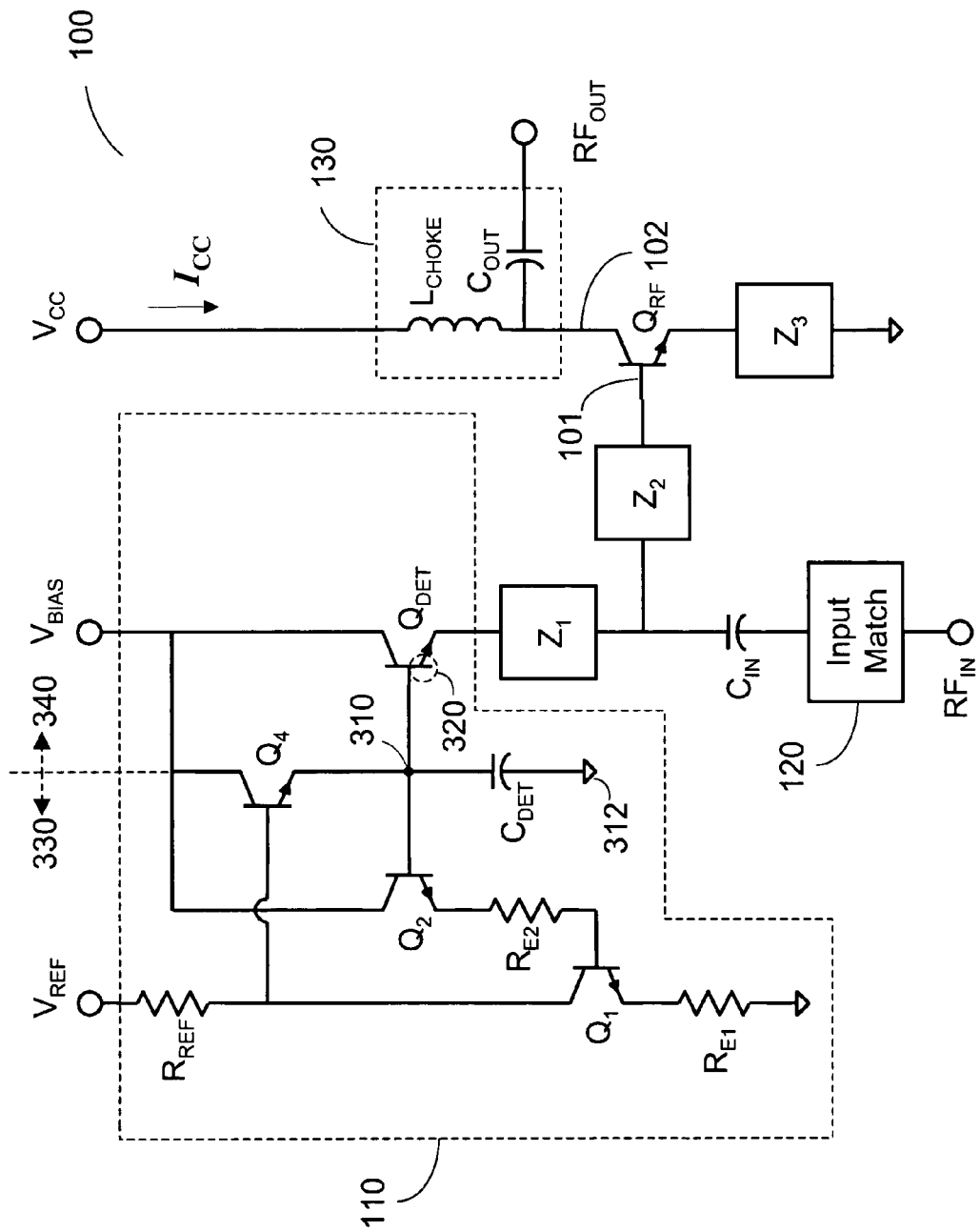
FIG. 3 is a circuit schematic diagram illustrating a bias circuit in the BJT amplifier circuit according to one embodiment of the present invention.

In one embodiment of the present invention, as illustrated in FIG. 3, the bias circuit 110 in the amplifier network 100 includes bias transistors $Q_1$ and $Q_2$, two emitter degeneration resistors $R_{E1}$ and $R_{E2}$ associated with the bias transistors $Q_1$ and $Q_2$, respectively, a reference resistor $R_{REF}$, a buffer transistor $Q_4$, a detecting transistor $Q_{DET}$, and a bypass capacitor $C_{DET}$ associated with the detecting transistor $Q_{DET}$. The bias circuit 110, the power-amplifying device $Q_{RF}$, and the impedance elements $Z_1$, $Z_2$, and $Z_3$ together form a current mirror with the bases of transistor $Q_4$ and $Q_{DET}$ connected to a common connected-base node 310, transistor $Q_1$ coupled with transistor $Q_2$ in a Darlington configuration with the emitter of transistor $Q_2$ coupled to the base of transistor $Q_1$, and power-amplifying device $Q_{RF}$ coupled with transistor $Q_{DET}$ also in a Darlington configuration with the emitter of transistor $Q_{DET}$ coupled to the input 101 of power-amplifying device $Q_{RF}$. Thus, DC conducting circuit elements in the amplifier network 100 to the left of the connected-base node 310, such as transistors $Q_1$ and $Q_2$, and resistors $R_{E1}$ and $R_{E2}$, form a reference branch 330 of the current mirror, and DC conducting elements to the right of the base node 310, such as transistors $Q_{RF}$ and $Q_{DET}$, and DC conducting elements in the impedance elements $Z_1$, $Z_2$, $Z_3$, form an amplifier branch 340 of the current mirror.

Transistor $Q_4$ is a buffer transistor for the current mirror and has its base coupled to the $V_{REF}$ input via the reference resistor $R_{REF}$, its emitter coupled to the connected-base node 310, and its collector coupled to the $V_{BIAS}$ input. Transistor $Q_{DET}$ has its collector coupled to the $V_{BIAS}$ input and its emitter coupled to the input 101 of the power amplifying device $Q_{RF}$ through impedance elements $Z_1$ and $Z_2$. Transistor $Q_2$ has its collector coupled to the $V_{BIAS}$ input and its emitter coupled to the base of transistor $Q_1$ via the resistor $R_{E2}$. Transistor $Q_1$ has its emitter coupled to the circuit ground through resistor $R_{E1}$ and its collector coupled to the $V_{REF}$ input through resistor $R_{REF}$. Bypass capacitor $C_{DET}$ is coupled between the base of transistor $Q_{DET}$ and an RF ground 312, which can be a circuit ground, or a DC voltage terminal, such as the $V_{REF}$, $V_{BIAS}$, or $V_{CC}$ terminal.

Figure 4:
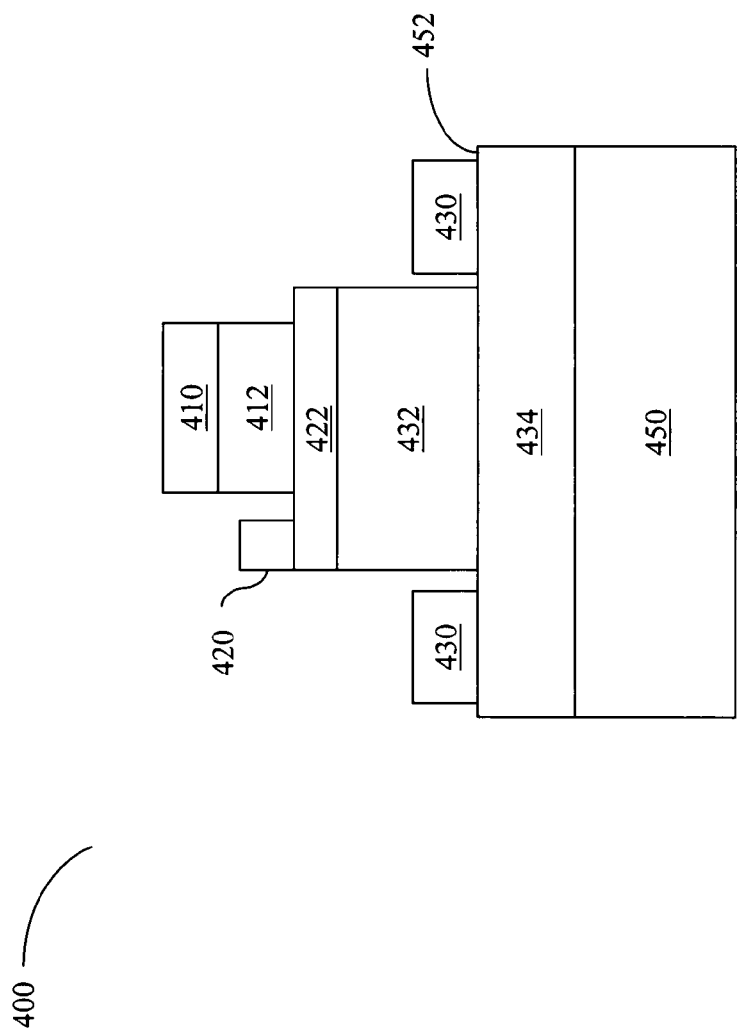
FIG. 4 is a cross-sectional view of a bipolar junction transistor (BJT) in the amplifier circuit shown in FIG. 3 according to one embodiment of the present invention.

In one embodiment, each of the four transistors $Q_1$, $Q_2$, $Q_4$, and $Q_{DET}$ is a BJT formed on a same semiconductor die with the power-amplifying device $Q_{RF}$, and shares a common DC current gain factor, $\beta >> 1$ with the BJT in the power-amplifying device $Q_{RF}$. FIG. 4 is a simplified block diagram of a cross-sectional view of a BJT 400 that can be used as the transistor $Q_1$, $Q_2$, $Q_4$, $Q_{DET}$, or the BJT in the power-amplifying device $Q_{RF}$. As shown in FIG. 4, BJT 400 includes an emitter 410 formed over an emitter layer 412, which is formed over a base layer 422, on which is also formed a base 420. The base layer 422 is formed over a collector layer 432, which is formed over a subcollector layer 434, on which is also formed a collector 430. The subcollector layer is formed near a top surface 452 of a substrate 450.

The BJT 400 can be fabricated using any of the BJT technologies in the art. In one embodiment of the present invention, the BJT 400 is fabricated using a Gallium Arsenide HBT semiconductor processing technology, and the emitter 410 includes a N+ InGaAs contact over a N+ InGaAs graded cap layer over a N+ GaAs cap contact layer. The emitter layer 412 includes a N-type AlGaAs or InGaP layer, the base layer 422 includes a P+ GaAs layer, the collector layer 432 includes a N– GaAs layer, the subcollector layer 434 includes a N+ GaAs layer, and the substrate 450 is a GaAs substrate. The BJT 400 may also be fabricated using an Indium Phosphide (InP) semiconductor process technology with an InP layer in the emitter layer 412, the base layer 422, and/or the collector layer 432. In another embodiment, the BJT 400 is fabricated using a SiGe semiconductor processing technology with SiGe in the emitter layer 412, the base layer 422, and/or the collector layer 432.

Because of the current mirror configuration in the bias circuit 110, as shown in FIG. 3, the bias current $I_{B,TOT}$ drawn by the power-amplifying device $Q_{RF}$ from the bias circuit 110 is insensitive to variations in the current gain $\beta$ of transistor $Q_1$ and current gain $\beta_{RF}$ of power-amplifying device $Q_{RF}$, so long as $\beta$ and $\beta_{RF}$ track one another, a simple requirement that is not difficult to achieve for transistor devices manufactured on a same semiconductor die. The quiescent collector current of transistor $Q_{RF}$ can be designed as a scaled ratio of the quiescent collector current of $Q_1$ by adjusting an effective emitter area ratio associated with the two transistors, again a simple requirement for devices on a same semiconductor die. The quiescent base-emitter voltage $V_{BE1}$ of transistor $Q_1$ sets the quiescent base-emitter voltage $V_{BE}$ of transistor $Q_{RF}$ and can provide a nearly constant $V_{BE}$ over increasing $RF_{IN}$ power up to a certain point, as illustrated by the curves 222, 224, and 226 in FIG. 2.

The buffer transistor $Q_4$ amplifies and buffers the reference current through the resistor $R_{REF}$ and effectively decouples the bias current from any limitations of $V_{REF}$ and $R_{REF}$ while maintaining the benefits of the current mirror configuration, as described above.

In one embodiment, transistors $Q_1$ and $Q_2$ in the reference branch 330 of the current-mirror serve as a scaled-down version of transistors $Q_{RF}$ and $Q_{DET}$, respectively, in the amplifier-branch 340 of the current mirror. In one embodiment, the effective emitter areas of transistors $Q_{RF}$ and $Q_{DET}$ are N-times as large as the effective emitter areas of transistors $Q_1$ and $Q_2$, respectively, where N is a scaling factor. The scaling factor N is generally chosen to be large such that the current drawn through transistor $Q_1$ is small compared to the quiescent collector current of the power-amplifying device $Q_{RF}$. If K is the factor by which the collection current $I_{CC}$ of the power-amplifying device $Q_{RF}$ would increase over the quiescent collector current $I_{CQ}$ to support a required RF power range, then N should preferably satisfy the inequality, $NK << \beta^2$, to ensure that the reference branch of the current mirror is not starved for current during peak RF envelope power excursions. In one embodiment, the emitter area of buffer transistor $Q_4$ is chosen so as not to limit the current into the base of transistor $Q_{DET}$ during peak RF operating conditions.

Resistor $R_{REF}$ is designed to set the quiescent collector current of transistor $Q_{RF}$, which is approximately given by, $$I_{CQ} \cong \left( \frac{V_{REF} - V_{BE1} - V_{BE2} - V_{BE4}}{R_{REF} + R_{E1}} \right) N$$

where $V_{BE1}$, $V_{BE2}$, and $V_{BE4}$ are the forward voltage drops across the base-emitter junctions of $Q_1$, $Q_2$ and $Q_4$, respectively, and the voltage drop across $R_{E2}$ is assumed to be small. For a given BJT process technology, the magnitude of the voltage $V_{BE}$ across the base-emitter junction of power-amplifying device $Q_{RF}$ is relatively insensitive to the forward current and is typically in the range of 0.9-1.0V when power-amplifying device $Q_{RF}$ includes a Si-based BJT, or in the range of 1.3-1.4V when power-amplifying device $Q_{RF}$ includes a GaAs-based HBT.

Resistors $R_{E1}$ and $R_{E2}$ are generally chosen to mirror, in a scaled form, the DC resistance of $Z_3$ and $(Z_1+Z_2)$, respectively, such that $R_{E1} \cong N(Z_{3,DC})$, and $R_{E2} \cong N(Z_{1,DC}+Z_{2,DC})$.

The design constraints pertaining to impedance elements $Z_1$, $Z_2$, and $Z_3$ are numerous. To ensure thermal stability for the transistor or transistor cell array comprised in $Q_{RF}$, an impedance sum of $Z_{Ballast}=(Z_3+Z_2/\beta)$ should be sufficiently large at DC and up to a frequency roughly equal to $1/\tau_{th}$, where $\tau_{th}$ is a dominant thermal time constant for the power-amplifying device $Q_{RF}$. In the situation power-amplifying device $Q_{RF}$ comprises a transistor array, the impedance sum $Z_{Ballast}$ may also include a contribution of $Z_1/\beta$ from impedance element $Z_1$, depending on the exact layout of the $Q_{RF}$ transistor cell array. The sum of $Z_{Ballast}=(Z_3+Z_2/\beta+Z_1/\beta)$ at DC is generally designed to be a minimum value required for thermal stability, as any excess resistance in the amplifier network 100 places increasing demands on the bias circuit 110 to compensate for the voltage drops along the bias current path through the input 101 of the power amplifying device $Q_{RF}$. At the RF carrier frequency, $Z_1$, $Z_2$, and $Z_3$ should cooperate with the input match 120 to provide low reflection at the $RF_{IN}$ terminal. At the modulation frequency and the second harmonic frequency, $Z_1$, $Z_2$, and $Z_3$ are generally designed to provide low IMD distortion when the input signal power is relatively small.

As discussed above, the bias circuit 110 sets a bias current and controls the quiescent condition and temperature compensation for the power-amplifying device $Q_{RF}$. As the RF input power increases, the base-emitter junction of the power-amplifying device $Q_{RF}$ begins to rectify as does the base-emitter junction of transistor $Q_{DET}$, and this sets up the sequence of positive-half-cycle and negative-half-cycle perturbations to the quiescent bias condition described above with reference to FIG. 1. In one embodiment of the present invention, a detector function as described below is provided by the detecting transistor $Q_{DET}$ and bypass capacitor $C_{DET}$. The base-emitter junction of the detecting transistor $Q_{DET}$ in the bias circuit 110 provides a PN junction diode 320 having a P-terminal coupled to the RF ground 312 through the bypass capacitor $C_{DET}$ and an N-terminal coupled to the terminal $RF_{IN}$ through the impedance element $Z_1$, the blocking capacitor $C_{IN}$, and the input match section 120. Because the P-terminal is held to a DC voltage through the bypass capacitor, the PN junction diode 320 is allowed to respond to the RF modulation envelope in the input RF signal by rectifying each negative half cycle in the input RF signal. The charge accumulated in each negative half cycle is deposited in the bypass capacitor $C_{DET}$ and a properly amplified and delayed version of this charge is returned back through the emitter of the detecting transistor $Q_{DET}$. The series combination of bypass capacitor $C_{DET}$, the base-emitter junction of the detecting transistor $Q_{DET}$, impedance element $Z_1$, and blocking capacitor $C_{IN}$, as shown in FIG. 3, facilitates a charge-pump action to help drive this charge into the base of $Q_{RF}$, resulting, on an average, an effective bias circuit gain depending on the RF input power in the dynamic bias current $I_{B,TOT}$.

The effective bias circuit gain results in increasing voltage at the base of the power-amplifying transistor $Q_{RF}$ with increasing RF power level in the RF input signal. The increasing voltage at the base of the power-amplifying transistor $Q_{RF}$ offsets the increasing voltage drops across $Z_1$, $Z_2$, and $Z_3$ as the RF power level increases. Thus, the bias circuit 110 dynamically modifies, on the time scale of the modulation in the RF input signal, the base-to-emitter voltage of the RF amplifying transistor $Q_{RF}$. When this dynamic bias action is adjusted correctly through proper design of the three impedance elements, the embodiments of the present invention achieve a much improved $V_{BE}(P_{IN})$ curve and, as a result, a substantial reduction in odd-order intermodulation distortion over a useful input power range (approximately 6-10 dB), while at the same time providing the necessary bias isolation, matching, power/phase distribution, and ballasting for the power-amplifying device $Q_{RF}$. In this way, the higher efficiency of reduced conduction angle operation is realized while the linearity requirements of the communication signal is satisfied.

The charge-pump action described above should be slow enough to smooth the individual RF cycle peaks but fast enough to follow the modulation envelope. These requirements can be used to set upper and lower bounds for the values of $C_{DET}$. As a non-limiting example, the upper and lower bounds of $C_{DET}$ are set to be about $$\frac{1}{2\pi Z_{BASE} F_{MOD}} \text{ and } \frac{1}{2\pi Z_{BASE} F_{RF}},$$

respectively, where $F_{MOD}$ is the highest modulation frequency in the RF input signal 140, $F_{RF}$ is the RF carrier frequency in the RF input signal 140, and $Z_{BASE}$ is the magnitude of the impedance at the base node of detecting transistor $Q_{DET}$ when detecting capacitor $C_{DET}$ is removed from the circuit.

FIGS. 5(a)-5(f) are a schematic diagrams illustrating exemplary embodiments of the impedance elements $Z_1$, $Z_2$, and $Z_3$ as two-terminal networks for the sake of illustration. At frequencies near 1 GHz and above, these elements are more accurately described as two-port impedance networks interacting with a circuit ground plane. Elements $Z_2$ and $Z_3$ should be placed in close physical proximity with transistors $Q_{RF}$ and $Q_{DET}$ and are typically integrated within the same semiconductor die as the transistors. As such, they may be constrained by the integrated circuit fabrication technology and limited to such networks depicted in FIGS. 5(a), 5(b), and 5(c) with the capacitance C typically less than 100 pF, or limited to such networks depicted in 5(d), 5(e), and 5(f) for modest values of inductance L typically less than 5 nH. Element $Z_1$ is generally less constrained and can take any of the forms shown in FIGS. 5(a) through 5(f), or another form as needed to satisfy the electrical and thermal requirements described above with reference to FIG. 3. $Z_1$ can be realized within the same semiconductor die as the transistors, outside the semiconductor die, or as some combination thereof.

The sensitivity of the PN junction diode 320, and thus the sensitivity of the effective bias circuit gain, to the changes in the RF input power, can be adjusted by adjusting the amount of RF impedance in the impedance elements $Z_1$. For a given $Z_1$, the rectifying effect of the PN junction diode 320 in the detecting transistor $Q_{DET}$ is about the same, whether $Z_1$ is lumped or distributed among the transistor cells in the power-amplifying device $Q_{RF}$, if power-amplifying device $Q_{RF}$ includes an array of transistor cells.

Figure 5F:
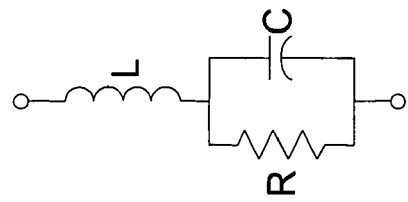
FIGS. 5(a)-5(f) are circuit schematic diagrams illustrating several exemplary embodiments for the impedance elements in the BJT amplifier circuit.
Figure 5E:
Figure 5D:
Figure 5C:
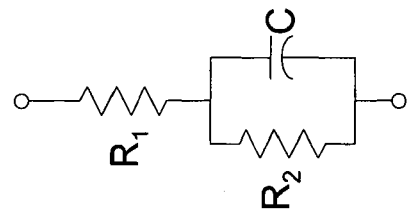
Figure 5B:
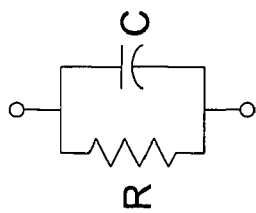
Figure 5A:
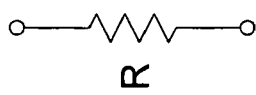

In a non-limiting example, $Z_2$ is not required, $Z_1$ takes the form shown in FIG. 5(a) with R in the range of about 15Ω to about 100Ω, and $Z_3$ also takes the form shown in FIG. 5(a) with R in the range of about 1Ω to about 6Ω. In another example, $Z_2$ is not required, $Z_3$ takes the form shown in FIG. 5(a) with R in the range of about 0.5Ω to about 3Ω, and $Z_1$ takes the form shown in FIG. 5(c) with $R_1$ in the range of about 15Ω to about 100Ω, $R_2$ in the range of about 50Ω to about 300Ω, and C around 10 pF. In a further example, $Z_1$ takes the form shown in FIG. 5(a) with R in the range of about 15Ω to about 100Ω, $Z_2$ takes the form shown in FIG. 5(b) with R in the range of about 50Ω to about 300Ω and C around 10 pF, and $Z_3$ takes the form shown in FIG. 5(a) with R in the range of about 0.5Ω to about 3 Ω.

Figure 2:
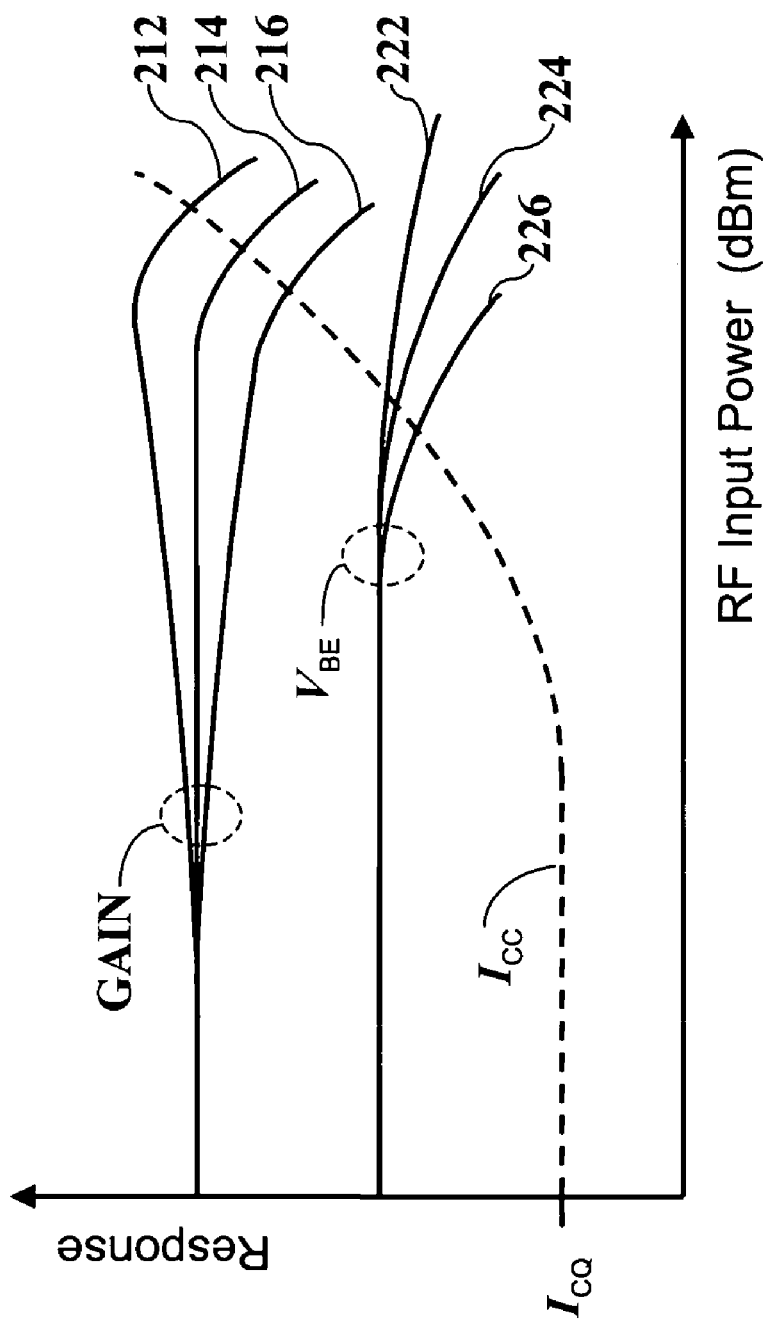
FIG. 2 is a chart illustrating the power gain, base-emitter voltage ($V_{BE}$) and collector current ($I_{CC}$) characteristics as a function of input RF signal power commonly associated with a class-AB amplifier.

The circuit topology and design guidelines described above should provide a dynamic bias circuit gain sufficient to overcome, to a first order, the voltage drops across $Z_1$, $Z_2$, and $Z_3$ thus leading to a desirable $V_{BE}(P_{IN})$ characteristics and linear power gain characteristic, as depicted by the $GAIN(P_{IN})$ curves 222 and 212 in FIG. 2. Computer simulation can be used to provide a more detailed circuit analysis and to further refine the design of the amplifier network 100 to satisfy the linearity requirements of a particular communication signal or system.

Figure 6:
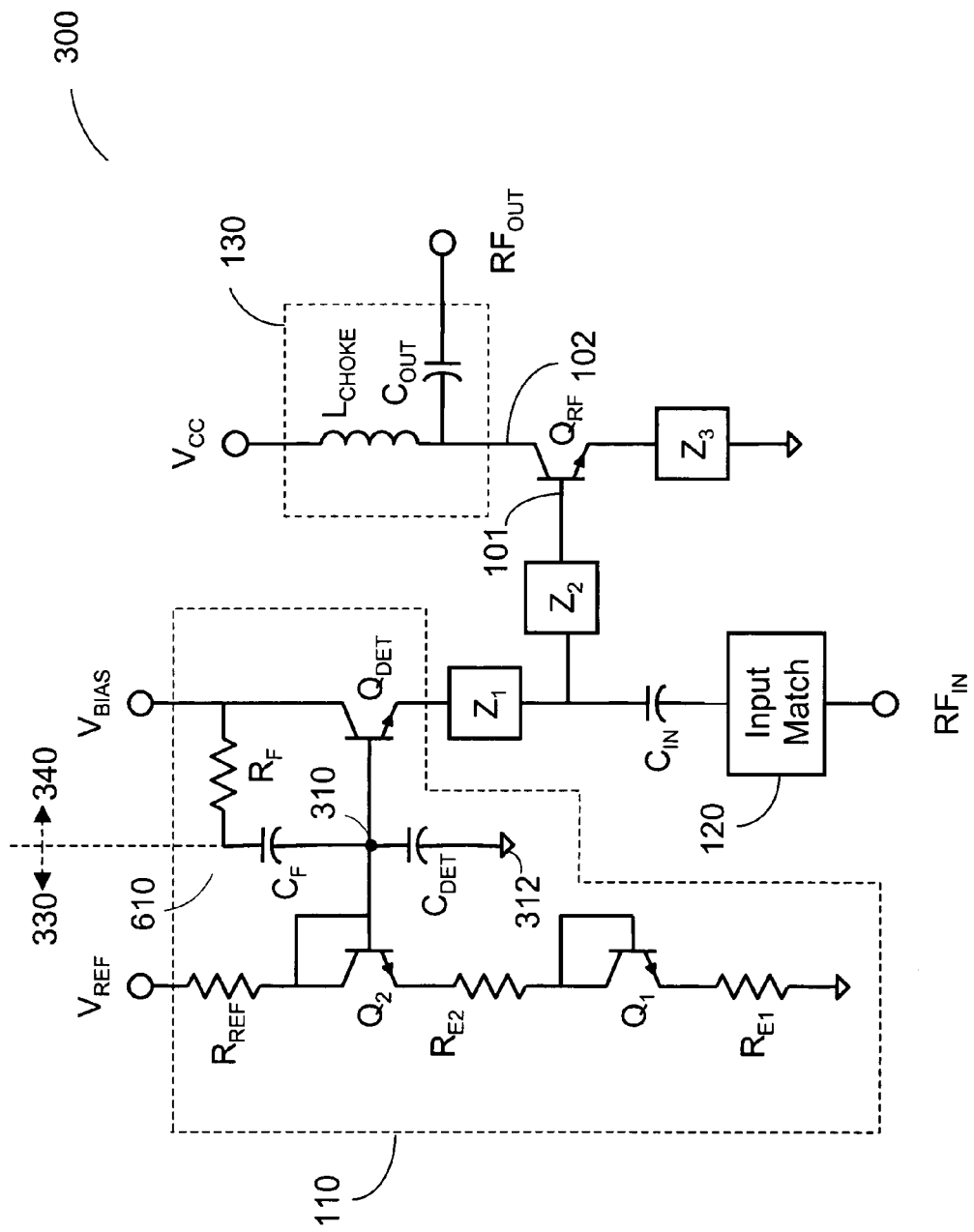
FIG. 6 is a circuit schematic diagram illustrating a modified current mirror bias network according to an alternative embodiment of the present invention.

In an alternative embodiment, the bias circuit 110 lacks the buffer transistor $Q_4$, as shown in FIG. 6, and is generally suited to applications requiring a smaller amplifying transistor $Q_{RF}$, or applications having a lower reference voltage, $V_{REF}$, which is unable to support the voltage drops across the base-emitter junctions of all of the three transistors $Q_4$, $Q_{DET}$, and $Q_{RF}$, as shown in FIG. 3. Without the buffer transistor $Q_4$, the base and collector of transistor $Q_2$ are tied and are coupled to the $V_{REF}$ terminal through the resistor $R_{REF}$. FIG. 6 also illustrates an example of a negative feedback network 610 including a capacitor $C_F$ and a resister $R_F$ serially coupled with each other between the $V_{BIAS}$ terminal and the connected bases of transistors $Q_2$ and $Q_{DET}$, and is designed to suppress electrical oscillations within the bias circuit 110.

In yet another embodiment, the bias circuit 110 includes a transistor-resistor tier 710 including a resistor $R_{E1}$, a transistor $Q_1$, a resistor $R_{E2}$, a transistor $Q_2$, a resistor $R_{E3}$, and a transistor $Q_3$ serially connected with each other between $R_{REF}$ and a circuit ground. Transistors $Q_1$, $Q_2$, and $Q_3$ each has its base and collector tied. The bias circuit 110 in FIG. 7 includes an additional transistor $Q_5$ coupled with the transistor $Q_3$ in a current mirror arrangement with their bases connected to a common connected-base node 720. The buffer transistor $Q_4$ is absent and the negative feedback network 610 is provided between the base and collector of transistor $Q_5$. The DC conducting circuit elements in FIG. 7 to the left of the connected-base node 720 form a reference branch 722 of the current mirror, while DC conducting elements to the right of the base node 720 form an amplifier branch 724 of the current mirror. In one embodiment, the reference branch 722 includes transistors $Q_1$, $Q_2$, and $Q_3$, and the amplifier branch 724 includes transistors $Q_{RF}$, $Q_{DET}$, and $Q_5$. As in the previously described embodiments, transistors $Q_1$, $Q_2$, and $Q_3$ in the reference branch 722 of the current-mirror serve as a scaled-down version of transistors $Q_{RF}$, $Q_{DET}$, and $Q_5$, respectively, in the amplifier-branch 724 of the current mirror.

Figure 7:
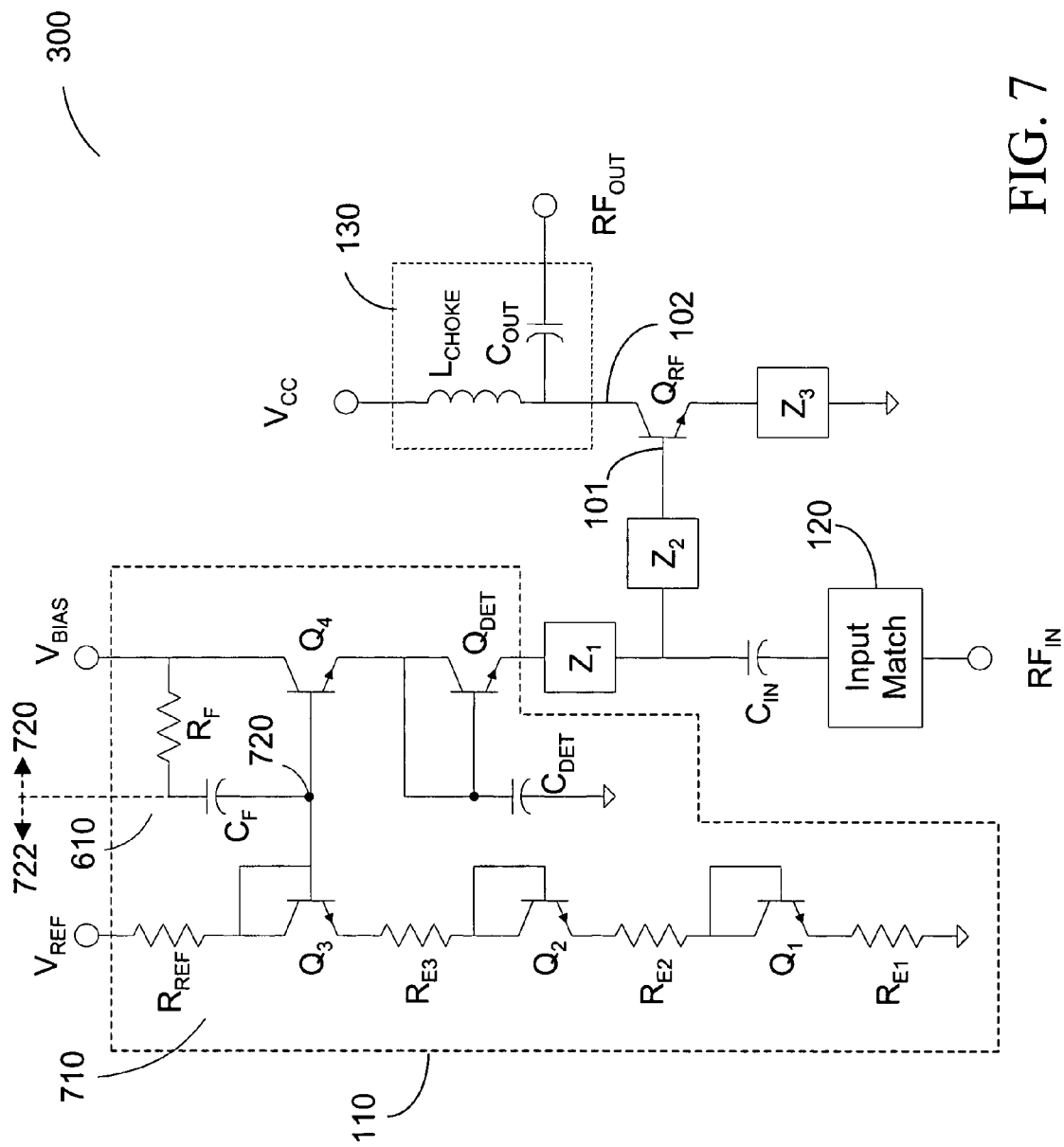
FIG. 7 is a circuit schematic diagram illustrating a modified current mirror bias network according to yet another alternative embodiment of the present invention.

The detector function in FIG. 7 is provided by the detecting transistor $Q_{DET}$, which is configured in the form of a level-shifting diode with its connector and base tied and connected to the emitter of transistor $Q_5$. As in all the previously described embodiments, the bypass capacitor $C_{DET}$ is coupled between the base of the detecting transistor $Q_{DET}$ and the circuit ground. The embodiment shown in FIG. 7 offers more flexibility in terms of temperature compensation via transistors $Q_1$ and $Q_2$ and their respective emitter resistors $R_{E1}$ and $R_{E2}$. Charge drawn from the bypass capacitor $C_{DET}$ down through the detecting transistor $Q_{DET}$ in the amplifier network 100 shown in FIG. 7, however, lacks the current gain exhibited by the embodiments shown in FIGS. 3 and 6. But the basic operating principles of the bias circuit 110 are the same in all of the embodiments described above.

Figure 8:
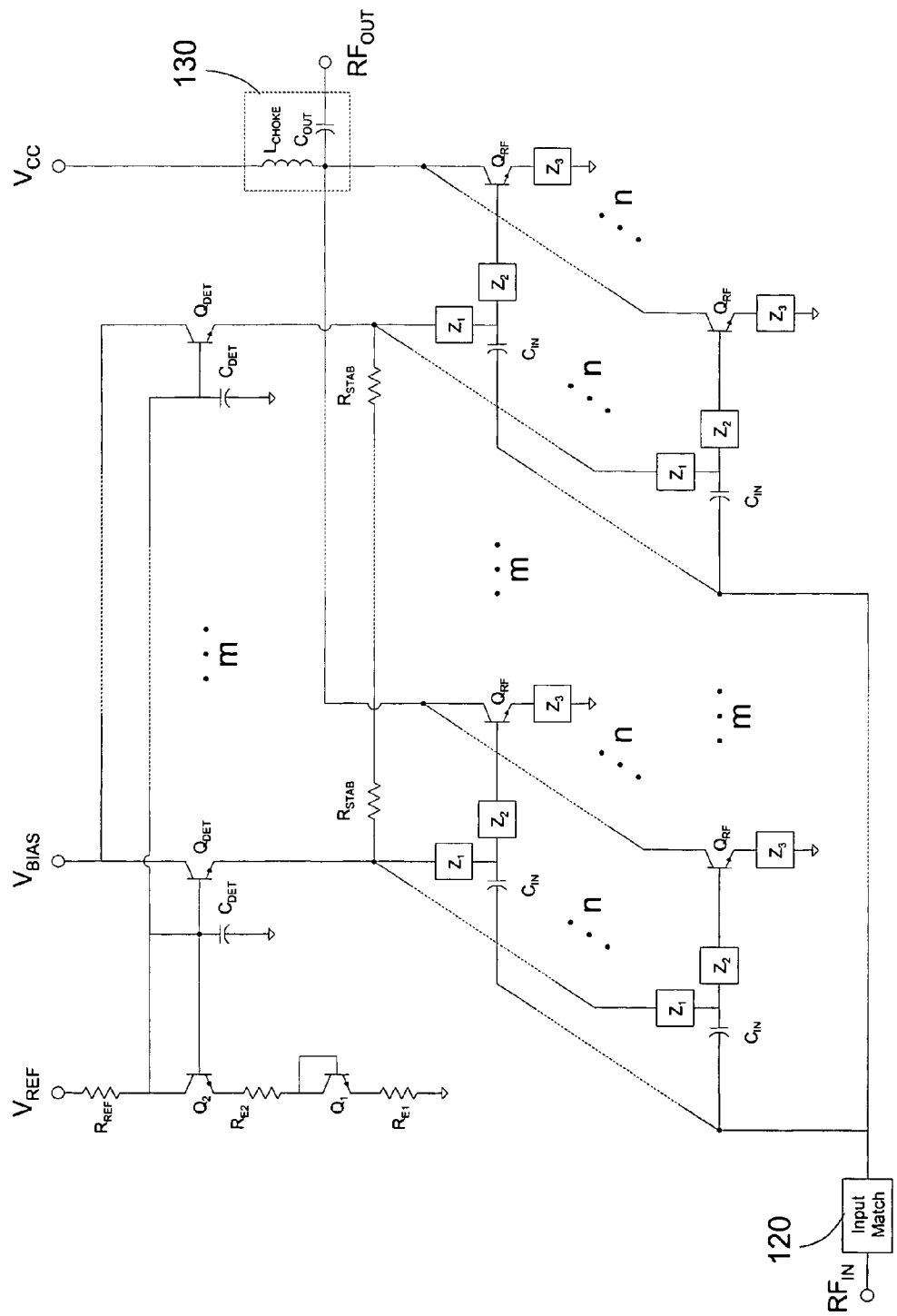
FIG. 8 is a circuit schematic diagram illustrating a distributed current mirror bias network for a physical BJT array according to embodiments of the present invention.

FIG. 8 is a schematic diagram illustrating an amplifying network 800 according to yet another embodiment of the present invention. As shown in FIG. 8, amplifying network comprises an array of n rows by m columns of transistor cells with a total of (m)(n) transistor cells each labeled as $Q_{RF}$. Such transistor cell arrays are common in modern semiconductor RF power devices. The transistor cell array may be large enough to require the three impedance elements $Z_1$, $Z_2$, $Z_3$ and blocking capacitor $C_{IN}$ to be distributed among the transistor cells to satisfy the RF phase and thermal stability requirements. The detecting transistor $Q_{DET}$ and its associated bypass capacitor $C_{DET}$ are generally required to be placed in close proximity with the amplifying transistor cells, so these elements are distributed across the m columns in the transistor array but can be lumped within each of the m columns, as shown in FIG. 8. A resistor $R_{STAB}$ is often included in the bias circuit and is coupled between the emitters of two adjacent detecting transistors $Q_{DET}$ to suppress odd-mode oscillations therein. The values of the distribution of parallel elements shown in FIG. 8 are scaled from the respective lumped circuit element values described in FIG. 6, as listed in Table 1.

TABLE 1

| (I) Lumped Circuit Element value in FIG. 6 | (II) Equivalent Distributed Circuit Element Value in FIG. 8 | Change from (I) to (II) |
| --- | --- | --- |
| $R_{REF}$ | $R_{REF}$ | Unchanged |
| $R_{E1}$ | $R_{E1}$ | Unchanged |
| $R_{E2}$ | $R_{E2}$ | Unchanged |
| ($Q_1$ Area) | ($Q_1$ Area) | Unchanged |
| ($Q_2$ Area) | ($Q_2$ Area) | Unchanged |
| ($Q_{DET}$ Area) | ($Q_{DET}$ Area)/m | Scale Down by m |
| $C_{DET}$ | ($C_{DET}$)/m | Scale Down by m |
| $C_{IN}$ | $C_{IN}$/(mn) | Scale Down by mn |
| $Z_1$ | $Z_1$(mn) | Scale Up by mn |
| $Z_2$ | $Z_2$(mn) | Scale Up by mn |
| $Z_3$ | $Z_3$(mn) | Scale Up by mn |
| ($Q_{RF}$ Area) | ($Q_{RF}$ Area)/(mn) | Scale Down by mn |

The input matching section 220 and output bias and matching section 230 need not be changed in going from the lumped circuit depicted in FIG. 6 to the distributed circuit depicted in FIG. 8. It is good RF design practice, however, to match the input and output phase delays to the individual transistor cells $Q_{RF}$ to maximize the gain and power combining efficiency of the transistor cell array. Such standard layout practices are common and familiar to those skilled in the art of integrated-circuit power amplifiers and are not explicitly shown in FIG. 8.

Figure 9:
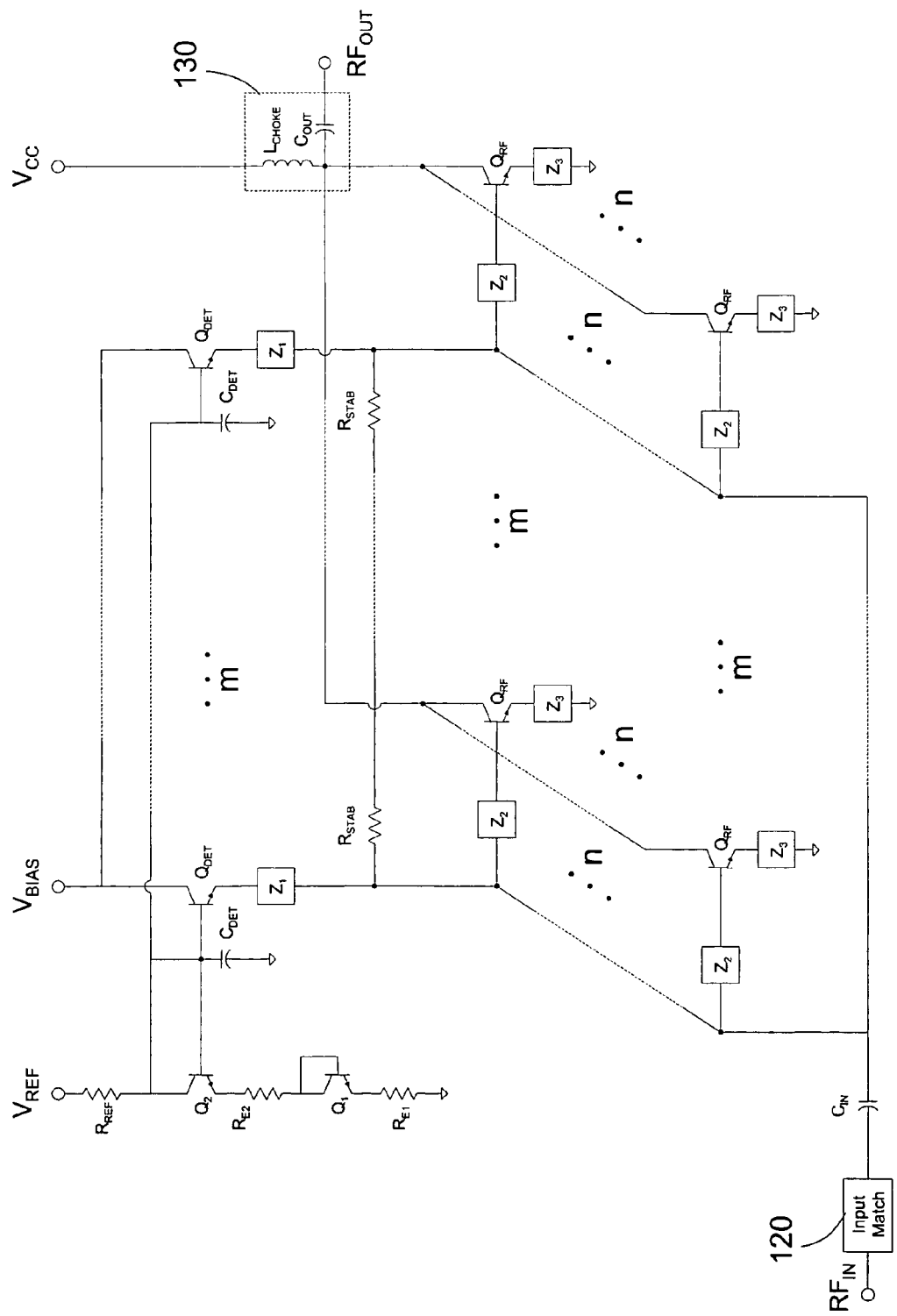
FIG. 9 is a circuit schematic diagram illustrating a distributed current mirror bias network for a physical BJT array according to alternative embodiments of the present invention.

FIG. 9 is a schematic diagram illustrating another embodiment of a distributed amplifier network 900 wherein the transistor column length n is short enough and the impedance element $Z_1$ is low enough to allow $Z_1$ to be lumped within each transistor column like the $Q_{DET}$ and $C_{DET}$ elements. Thus, amplifier network 900 shown in FIG. 9 is preferred where possible to amplifier network 800 shown in FIG. 8 because a simpler layout is provided in the amplifier network 900. The scaling rules for scaling the values of relevant circuit elements in network 900 from the values of the corresponding lumped circuit depicted in FIG. 6 are similar those for scaling the relevant circuit elements in network 800, as listed in Table 1, except that $Z_1$ is scaled up by a factor of m instead of mn, and the capacitance $C_{IN}$ is unchanged relative to that in FIG. 6.

Figure 10:
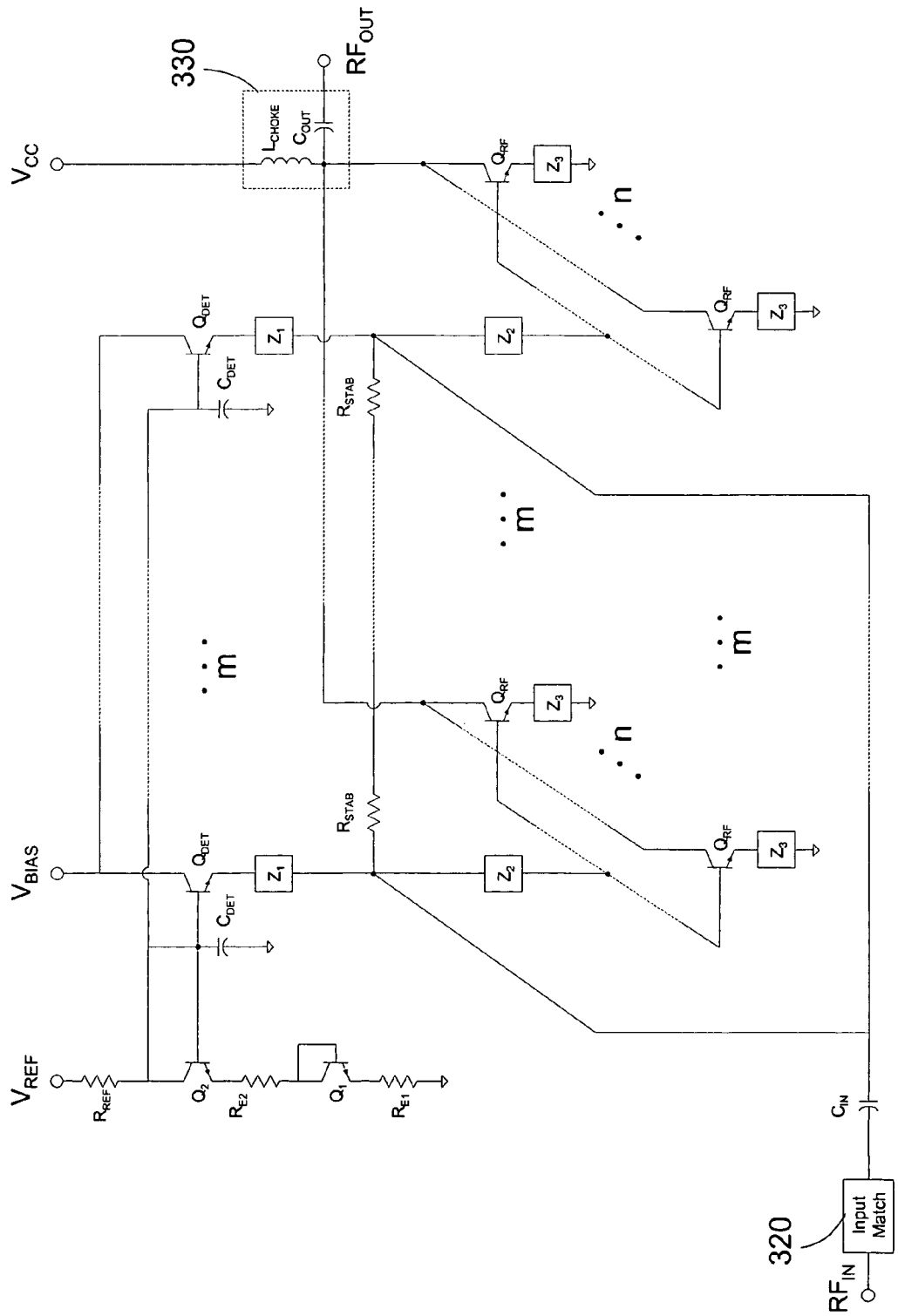
FIG. 10 is a circuit schematic diagram illustrating a distributed current mirror bias network for a physical BJT array according to yet another embodiment of the present invention.

FIG. 10 is a schematic diagram illustrating yet another embodiment of a distributed amplifier network 1000 wherein the transistor column length, n, is short enough and the impedance elements Z and $Z_2$ are low enough to allow both $Z_1$ and $Z_2$ to be lumped within each column like the $Q_{DET}$ and $C_{DET}$ elements. Thus, amplifier network 1000 shown in FIG. 10 is preferred where possible to amplifier network 800 or 900 shown in FIG. 8 or 9, respectively, because a simpler layout is provided in the amplifier network 1000. The scaling rules for scaling the values of relevant circuit elements in network 1000 from the values of the corresponding lumped circuit depicted in FIG. 6 are similar those for scaling the relevant circuit elements in network 800, as listed in Table 1, except that both $Z_1$ and $Z_2$ are scaled up by a factor of m instead of mn, and the capacitance $C_{IN}$ is unchanged relative to that in FIG. 6. With both $Z_1$ and $Z_2$ lumped, however, $Z_3$ needs to provide the full amount of ballasting.

The foregoing discussion and supporting illustrations are for exemplary purposes only and should not be construed as limiting the present invention. Substantial variations and combinations of the exemplary bias circuits may be practiced without departing from the spirit and scope of the present invention. For example, the embodiments described herein may be modified to include additional circuit elements to affect the stability and frequency response or to adjust the temperature or voltage compensation. Those skilled in the art will readily appreciate that these and other similar modifications are well within the scope of the present invention.

We claim:

1. A radio frequency (RF) amplifier circuit having an input terminal for receiving a RF input signal, comprising:
    a RF power-amplifying transistor having a base coupled to the input terminal;
    a bias circuit coupled to the input terminal and to the RF power-amplifying transistor, the bias circuit including a bypass capacitor and a PN junction diode having first and second terminals, the first terminal being coupled to the base of the RF amplifying transistor through at least one impedance element, the second terminal is coupled to a RF ground in the RF amplifier circuit through the bypass capacitor
    wherein the bias circuit is configured to raise a voltage at the base of the RF power-amplifying transistor in response to an increase in an RF power level in the RF input signal; and
    the PN junction diode is part of a detecting transistor having a base and a collector, the RF amplifier circuit further comprising:
    a reference voltage terminal for connecting to a reference voltage supply;
    a bias voltage terminal for connecting to a bias voltage supply;
    a first bias transistor having a collector coupled to the reference voltage supply through a reference resistor, an emitter coupled to a circuit ground terminal through a first emitter degeneration resistor, and a base; and
    a second bias transistor coupled with the detecting transistor in a current mirror configuration, the second bias transistor having a base connected to the base of the detecting transistor at a common connected base node, an emitter coupled to the base of the first bias transistor through a second emitter degeneration resistor, and a collector coupled to the bias voltage terminal.

2. The RF amplifier circuit of claim 1, wherein each of the at least one impedance element includes a two-port impedance network.

3. The RF amplifier circuit of claim 1, wherein the PN junction diode is part of a detecting transistor having a base and a collector that are tied to each other.

4. The RF amplifier circuit of claim 1, wherein the bypass capacitor is coupled between the common connected base node and the circuit ground.

5. The RF amplifier circuit of claim 1, further comprising a buffer transistor having a base coupled to the reference voltage terminal through the reference resistor, an emitter coupled to the common connected base node, and a collector coupled to the bias voltage terminal.

6. The RF amplifier circuit of claim 1, wherein the PN junction diode is part of a detecting transistor having a base and a collector, the RF amplifier circuit further comprising:
    a reference voltage terminal for connecting to a reference voltage supply;
    a first bias transistor having an emitter coupled to a circuit ground terminal through a first emitter degeneration resistor, and a base and a collector tied with each other; and
    a second bias transistor coupled with the detecting transistor in a current mirror configuration, the second bias transistor having a base connected to the base of the detecting transistor at a common connected base node, an emitter coupled to the tied base and connector of the first bias transistor through a second emitter degeneration resistor, and a collector tied to the base of the second bias transistor and coupled to the reference voltage terminal via a reference resistor.

7. The RF amplifier circuit of claim 6, further comprising a bias voltage terminal for connecting to a bias voltage supply, wherein the detecting transistor has a collector coupled to the bias voltage terminal; and
    a negative feedback network coupled between the collector of the detecting transistor and the common connected base node, the negative feedback network including a resistor and a capacitor serially connected with each other.

8. The RF amplifier circuit of claim 1, further comprising:
    a reference voltage terminal for connecting to a reference voltage supply;
    a tier of serially connected level-shifting diodes coupled between the reference voltage terminal and a circuit ground;
    a bias transistor having an emitter coupled to the PN junction diode, a base coupled to the tier of serially connected level-shifting diodes, and a collector coupled to the base of the bias transistor through a negative feedback network.

9. The RF amplifier circuit of claim 8, wherein the tier of serially connected level-shifting diodes includes first, second and third bias transistors and first, second, and third emitter degeneration resistors, each of the first, second and third bias transistors having a base and a collector tied with each other and an emitter coupled to respective ones of the first, second, and third emitter degeneration resistors.

* * * * *